(12) United States Patent
Lee

(10) Patent No.: US 11,378,624 B2
(45) Date of Patent: Jul. 5, 2022

(54) METHOD FOR DISPLAYING CHARGE AMOUNT OF BATTERY, AND BATTERY PACK AND ELECTRONIC DEVICE FOR PERFORMING SAME

(71) Applicant: Samsung SDI Co., Ltd., Yongin-si (KR)

(72) Inventor: Yongdai Lee, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 108 days.

(21) Appl. No.: 16/755,859

(22) PCT Filed: Jul. 24, 2018

(86) PCT No.: PCT/KR2018/008334
§ 371 (c)(1),
(2) Date: Apr. 13, 2020

(87) PCT Pub. No.: WO2019/088404
PCT Pub. Date: May 9, 2019

(65) Prior Publication Data
US 2021/0199721 A1 Jul. 1, 2021

(30) Foreign Application Priority Data
Oct. 31, 2017 (KR) .................. 10-2017-0143985

(51) Int. Cl.
*G01R 31/36* (2020.01)
*H02J 7/00* (2006.01)
(Continued)

(52) U.S. Cl.
CPC ....... *G01R 31/3646* (2019.01); *G01R 31/374* (2019.01); *H01M 10/4257* (2013.01);
(Continued)

(58) Field of Classification Search
CPC ............. G01R 31/3646; G01R 31/374; G01R 31/371; G01R 31/382; G01R 31/36;
(Continued)

(56) References Cited

U.S. PATENT DOCUMENTS 4,687,996 A * 8/1987 Okazaki ................. G01R 31/36
320/136
4,876,513 A * 10/1989 Brilmyer .............. G01R 31/379
324/427

(Continued)

FOREIGN PATENT DOCUMENTS

EP 1701175 A2 9/2006
EP 2899834 A1 7/2015
(Continued)

OTHER PUBLICATIONS

EIC 2800 Search Report for 16755859, Searcher Steve Chung, completed Oct. 1, 2021, (Year: 2021).*

(Continued)

*Primary Examiner* — John T Trischler
(74) *Attorney, Agent, or Firm* — Lewis Roca Rothgerber Christie LLP

(57) ABSTRACT

A battery pack can include a battery and a battery management system for detecting a charge amount of the battery, setting an indicated charge amount as the charge amount if the charge amount of the battery is smaller than a first threshold value, and setting the indicated charge amount as that of the following equation 1 when the charge amount of the battery is greater than or equal to the first threshold value.

Indicated charge amount=actual charge amount×correction rate=actual charge amount×(1+((100/second threshold value)−1)/(second threshold value−first threshold value)×(actual charge amount−first threshold value))), [Equation 1]

(Continued)

wherein the actual charge amount is the charge amount of the battery.

20 Claims, 5 Drawing Sheets

(51) Int. Cl.
| | |
|---|---|
| *H01M 10/48* | (2006.01) |
| *G01R 31/374* | (2019.01) |
| *H01M 10/42* | (2006.01) |
| *H01M 10/44* | (2006.01) |

(52) U.S. Cl.
CPC .......... *H01M 10/44* (2013.01); *H01M 10/443* (2013.01); *H01M 10/488* (2013.01); *H02J 7/0048* (2020.01); *H02J 7/007194* (2020.01); *H01M 2010/4271* (2013.01)

(58) Field of Classification Search
CPC ............. H02J 7/007194; H02J 7/0048; H01M 10/4257; H01M 10/443; H01M 10/488; H01M 10/425; H01M 10/44; H01M 10/42
USPC ........................................................ 320/137
See application file for complete search history.

(56) References Cited

U.S. PATENT DOCUMENTS

| | | | | |
|---|---|---|---|---|
| 5,578,915 | A * | 11/1996 | Crouch, Jr. ............ | H02J 7/0021 324/428 |
| 5,625,275 | A * | 4/1997 | Tanikawa ................. | H02J 7/04 320/160 |
| 6,160,377 | A * | 12/2000 | Fujii ...................... | H02J 7/0024 320/117 |
| 6,198,253 | B1 * | 3/2001 | Kurle .................... | A61N 1/3975 320/132 |
| 6,441,619 | B1 * | 8/2002 | Araki .................... | G01R 31/392 324/427 |
| 6,449,537 | B1 * | 9/2002 | Phillips .................... | B60K 6/48 701/22 |
| 6,483,274 | B2 * | 11/2002 | Lee ....................... | H02J 7/0047 320/132 |
| 6,522,148 | B2 * | 2/2003 | Ochiai ................. | G01R 31/374 324/428 |
| 6,932,174 | B2 * | 8/2005 | Hirata ................... | H01M 10/48 180/65.245 |
| 7,622,894 | B2 * | 11/2009 | Kawahara ............... | B60L 58/12 320/127 |
| 7,915,862 | B2 * | 3/2011 | Kim .................... | H01M 10/482 320/133 |
| 7,969,120 | B2 * | 6/2011 | Plett .................. | G01R 31/3828 320/145 |
| 8,004,241 | B2 * | 8/2011 | Kim ....................... | H02J 7/0047 320/132 |
| 8,054,045 | B2 * | 11/2011 | Kawahara .......... | G01R 31/3648 320/127 |
| 8,466,708 | B2 * | 6/2013 | Kawahara .......... | G01R 31/3828 324/764.01 |
| 8,766,597 | B2 * | 7/2014 | Nork ................... | H01M 10/425 320/118 |
| 8,994,334 | B2 * | 3/2015 | Shigemizu .......... | H01M 10/441 320/134 |
| 9,099,883 | B2 * | 8/2015 | Ahn ....................... | H02J 7/0077 |
| 9,121,909 | B2 * | 9/2015 | Liu .................... | G01R 31/3828 |
| 9,128,159 | B2 * | 9/2015 | Mousseau ............... | G06F 15/00 |
| RE45,797 | E * | 11/2015 | Kim ....................... | H02J 7/0047 |
| 9,244,128 | B2 * | 1/2016 | Haug ...................... | H02J 7/0029 |
| 9,263,777 | B2 * | 2/2016 | Kawahara .............. | G01R 31/367 |
| 9,287,723 | B2 * | 3/2016 | Kang .................... | H02J 7/0016 |
| 9,438,894 | B2 * | 9/2016 | Park ...................... | H04N 13/341 |
| 9,461,498 | B2 * | 10/2016 | Son ......................... | H02J 50/90 |
| 9,568,557 | B2 * | 2/2017 | Kudo ...................... | B60L 58/15 |
| 9,678,165 | B2 * | 6/2017 | Joe ........................ | H01M 10/48 |
| 9,684,036 | B2 * | 6/2017 | Depond ................. | G01R 31/36 |
| 9,711,992 | B2 * | 7/2017 | Jung ..................... | H01H 36/00 |
| 9,917,462 | B2 * | 3/2018 | Won ........................ | G06F 1/266 |
| 9,923,368 | B2 * | 3/2018 | Park ........................ | H02J 1/10 |
| 9,923,401 | B2 * | 3/2018 | Jung ................... | H02J 7/007192 |
| 10,056,778 | B2 * | 8/2018 | Kratzer ................. | B60L 3/0046 |
| 10,170,056 | B2 * | 1/2019 | Kim ...................... | G09G 5/10 |
| 10,256,658 | B2 * | 4/2019 | Hyun .................... | H02J 7/0042 |
| 10,263,435 | B2 * | 4/2019 | Kim ...................... | H02J 7/0018 |
| 10,284,009 | B2 * | 5/2019 | Park ........................ | H02J 9/00 |
| 10,298,029 | B2 * | 5/2019 | Cho ..................... | H02J 7/0047 |
| 10,317,971 | B2 * | 6/2019 | Shin ....................... | G06F 3/017 |
| 10,359,474 | B2 * | 7/2019 | Soga ................... | G01R 31/3648 |
| 10,361,580 | B2 * | 7/2019 | Cha ....................... | H02J 7/025 |
| 10,371,584 | B2 * | 8/2019 | Kim ..................... | H04M 1/72454 |
| 10,372,183 | B2 * | 8/2019 | Yamamoto ................ | G06F 1/28 |
| 10,408,887 | B2 * | 9/2019 | Shimizu ............... | G01R 31/374 |
| RE47,712 | E * | 11/2019 | Kim ...................... | H02J 7/0021 |
| 10,468,905 | B2 * | 11/2019 | Kim ....................... | H02J 50/12 |
| 10,523,065 | B2 * | 12/2019 | Jin ........................ | A61B 8/4245 |
| 10,574,077 | B2 * | 2/2020 | Choi ..................... | G06F 3/0679 |
| 10,601,263 | B2 * | 3/2020 | Park ........................ | H02J 50/80 |
| 10,705,147 | B2 * | 7/2020 | Shimizu ............. | G01R 31/3828 |
| 10,714,949 | B2 * | 7/2020 | Cho ...................... | H02J 7/0021 |
| 10,737,584 | B2 * | 8/2020 | Zhang ..................... | B60K 6/48 |
| 10,797,509 | B2 * | 10/2020 | Kim ......................... | H02J 7/04 |
| 10,855,099 | B2 * | 12/2020 | Kim ....................... | H02J 50/80 |
| 10,916,813 | B2 * | 2/2021 | Cha ...................... | H01M 10/42 |
| 11,016,853 | B2 * | 5/2021 | Kim ..................... | G06F 16/489 |
| 11,018,516 | B2 * | 5/2021 | Cho .................... | H04M 1/72448 |
| 11,050,303 | B2 * | 6/2021 | Park ........................ | H02J 50/80 |
| 2002/0030494 | A1 * | 3/2002 | Araki ................. | G01R 31/3828 324/427 |
| 2002/0171429 | A1 * | 11/2002 | Ochiai ................. | G01R 31/374 324/426 |
| 2003/0094321 | A1 | 5/2003 | Hirata et al. | |
| 2003/0097225 | A1 * | 5/2003 | Teruo ................ | G01R 31/3648 702/63 |
| 2004/0024546 | A1 * | 2/2004 | Richter ................. | H01M 10/48 702/63 |
| 2005/0052158 | A1 * | 3/2005 | Meissner ............. | G01R 31/392 320/132 |
| 2006/0117194 | A1 * | 6/2006 | Nishida ............... | G01R 31/3842 713/300 |
| 2006/0202857 | A1 | 9/2006 | Kawahara et al. | |
| 2008/0238207 | A1 * | 10/2008 | Kim .................... | H01M 10/482 307/71 |
| 2010/0030499 | A1 * | 2/2010 | Kawahara ............. | H02J 7/0049 702/63 |
| 2010/0085009 | A1 * | 4/2010 | Kang .................... | H02J 7/0016 320/118 |
| 2010/0244886 | A1 * | 9/2010 | Kawahara .......... | G01R 31/3828 324/764.01 |
| 2012/0056591 | A1 * | 3/2012 | Abe ..................... | H01M 10/48 320/132 |
| 2012/0169291 | A1 * | 7/2012 | Abe ..................... | H02J 7/0018 320/134 |
| 2012/0200298 | A1 * | 8/2012 | Zhang ................ | G01R 31/3835 324/427 |
| 2013/0099746 | A1 * | 4/2013 | Nork ...................... | B60L 58/22 320/118 |
| 2013/0110429 | A1 * | 5/2013 | Mitsuyama .......... | G01R 31/367 702/63 |
| 2013/0249488 | A1 * | 9/2013 | Ju ........................... | B60L 58/14 320/112 |
| 2013/0320989 | A1 * | 12/2013 | Inoue ..................... | B60L 58/16 324/427 |
| 2014/0084846 | A1 * | 3/2014 | Berkowitz ............ | H02J 7/0071 320/107 |
| 2014/0111142 | A1 * | 4/2014 | Lee ..................... | G06F 1/3206 320/107 |
| 2014/0163853 | A1 * | 6/2014 | Mousseau ............ | G01R 31/382 701/123 |
| 2014/0177145 | A1 * | 6/2014 | Kawahara ............ | H01M 10/482 361/679.01 |

(56) References Cited

U.S. PATENT DOCUMENTS

| | | | |
|---|---|---|---|
| 2014/0203813 A1* | 7/2014 | Driemeyer-Franco | B60L 58/21 324/434 |
| 2014/0232325 A1* | 8/2014 | Jung | H01H 36/00 320/107 |
| 2014/0236379 A1* | 8/2014 | Masuda | B60L 53/20 700/297 |
| 2014/0300321 A1* | 10/2014 | Kim | H02J 7/00047 320/111 |
| 2014/0312829 A1 | 10/2014 | Ha et al. | |
| 2015/0212161 A1 | 7/2015 | Soga et al. | |
| 2015/0244185 A1* | 8/2015 | Won | G06F 1/266 320/103 |
| 2015/0276885 A1 | 10/2015 | K.R. et al. | |
| 2015/0331053 A1* | 11/2015 | Depond | G01R 31/3648 324/426 |
| 2015/0362557 A1* | 12/2015 | Takashima | G01R 31/3842 324/426 |
| 2016/0036250 A1* | 2/2016 | Cho | H02J 7/0021 320/112 |
| 2016/0061910 A1* | 3/2016 | Peng | G01R 31/3646 324/428 |
| 2016/0109529 A1 | 4/2016 | Meacham | |
| 2016/0190861 A1* | 6/2016 | Cha | H02J 7/0021 320/108 |
| 2016/0318417 A1* | 11/2016 | Suzuki | H01M 10/48 |
| 2016/0344208 A1* | 11/2016 | Kawamura | B60L 58/16 |
| 2017/0176541 A1* | 6/2017 | Shimizu | B60L 58/12 |
| 2017/0176544 A1* | 6/2017 | Shimizu | G01R 31/392 |
| 2017/0229891 A1* | 8/2017 | Lee | H02J 7/04 |
| 2018/0037130 A1* | 2/2018 | Oh | B60L 53/00 |
| 2018/0106866 A1* | 4/2018 | Tan | G01R 19/165 |
| 2018/0329527 A1* | 11/2018 | Park | H02J 50/80 |
| 2019/0036356 A1* | 1/2019 | Subbaraman | H02J 7/0021 |
| 2019/0123394 A1* | 4/2019 | Cha | H01M 10/48 |
| 2019/0252892 A1* | 8/2019 | Cho | H02J 7/0021 |
| 2020/0119581 A1* | 4/2020 | Kim | H02J 50/80 |
| 2020/0144842 A1* | 5/2020 | Ha | H02J 7/0048 |
| 2020/0212514 A1* | 7/2020 | Jin | B60L 50/66 |
| 2020/0220367 A1* | 7/2020 | Cho | H02J 7/00047 |
| 2020/0309860 A1* | 10/2020 | Arima | G01R 31/3648 |
| 2021/0048479 A1* | 2/2021 | Hyun | H02J 7/00302 |
| 2021/0055348 A1* | 2/2021 | Kim | G01R 31/367 |
| 2021/0080506 A1* | 3/2021 | Wampler | G01R 31/387 |
| 2021/0083515 A1* | 3/2021 | Kim | H02J 7/0068 |
| 2021/0351606 A1* | 11/2021 | Cassarino | B60L 58/16 |
| 2022/0006313 A1* | 1/2022 | Lim | H02J 7/00714 |

FOREIGN PATENT DOCUMENTS

| | | | |
|---|---|---|---|
| JP | 2003-164006 A | | 6/2003 |
| JP | 2004150800 A | * | 5/2004 |
| JP | 4095878 B2 | * | 6/2008 |
| JP | 4852015 B2 | * | 1/2012 |
| JP | 2012-149970 A | | 8/2012 |
| JP | 2012-228074 A | | 11/2012 |
| JP | 5138062 B2 | * | 2/2013 |
| JP | 2016-80616 A | | 5/2016 |
| KR | 10-1097956 B1 | | 12/2011 |
| KR | 20120065293 A | * | 6/2012 |
| KR | 10-1399362 B1 | | 5/2014 |
| KR | 10-2014-0125636 A | | 10/2014 |
| KR | 10-2016-0046707 A | | 4/2016 |
| KR | 10-1646730 B1 | | 8/2016 |

OTHER PUBLICATIONS

EPO Extended European Search Report dated Jul. 6, 2021, issued in corresponding European Patent Application No. 18872427.2 (8 pages).

Japanese Office Action dated Apr. 26, 2021, issued in corresponding Japanese Patent Application No. 2020-523800 (2 pages).

* cited by examiner

Indicated charge amount = Actual charge amount x correction rate
= actual charge amount x (1 + ((100 / second threshold value) - 1) /
(second threshold value - first threshold value) x (actual charge amount
- first threshold value)))

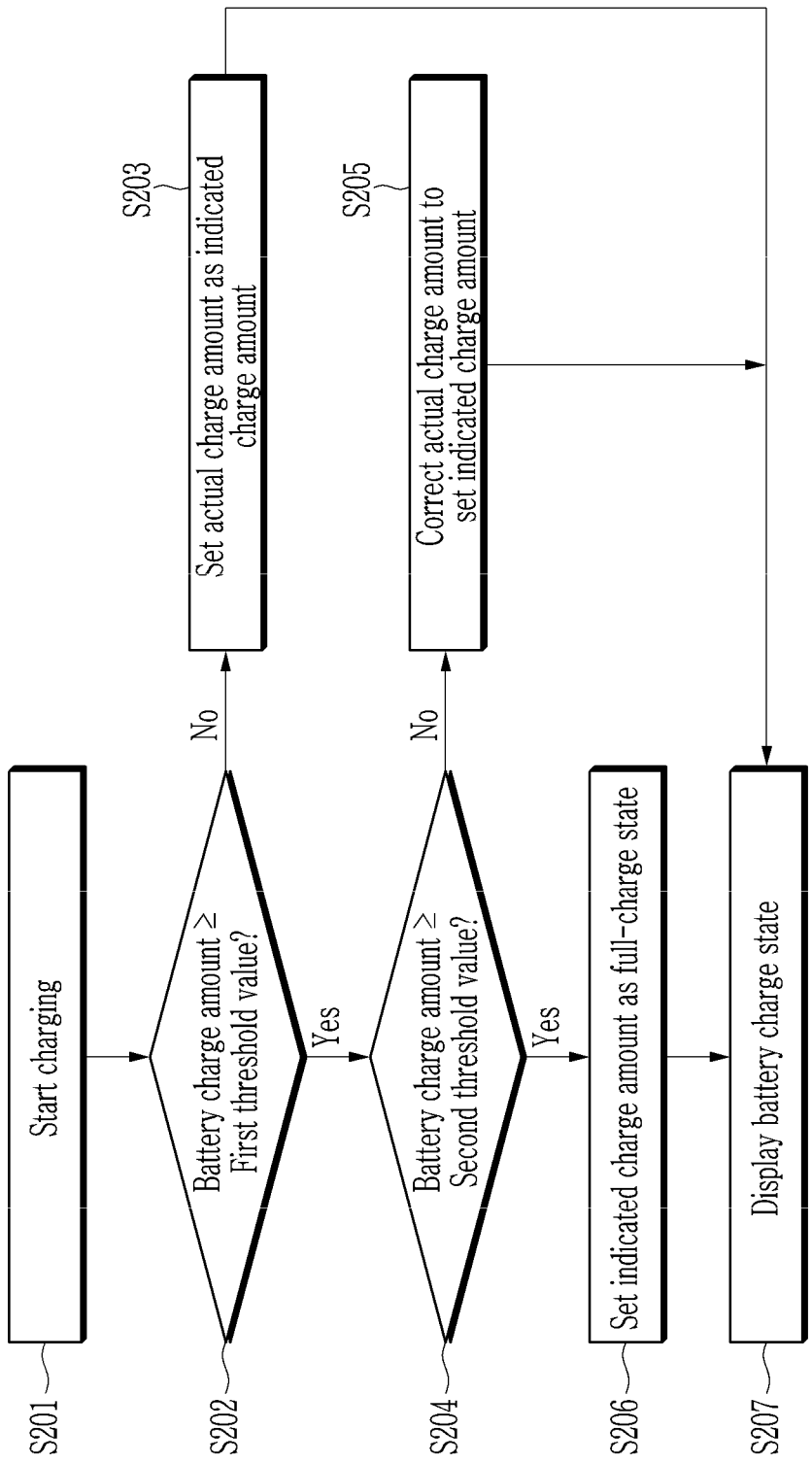

METHOD FOR DISPLAYING CHARGE AMOUNT OF BATTERY, AND BATTERY PACK AND ELECTRONIC DEVICE FOR PERFORMING SAME

CROSS-REFERENCE TO RELATED APPLICATIONS

This application is a National Phase Patent Application of International Patent Application Number PCT/KR2018/008334, filed on Jul. 24, 2018, which claims priority of Korean Patent Application No. 10-2017-0143985, filed Oct. 31, 2017, the entire contents of both of which are incorporated herein by reference.

TECHNICAL FIELD

An exemplary embodiment relates to a method for displaying a charge amount, and a battery pack and an electronic device that perform the same.

BACKGROUND ART

A secondary cell refers to a cell that can alternately repeat charging and discharging. The secondary cell may carry out discharge by converting chemical energy to electrical energy, and when charging electrical energy in a discharged state, the secondary cell may store the charged electrical energy in the form of chemical energy.

The secondary cell is combined with a charging/discharging circuit and thus forms a battery pack, and is charged by an external power source and discharged to an external load through a pack terminal provided in the battery pack.

Many of the products that use battery packs composed of secondary cells also display the remaining charge amount of the battery in the range of 0%-100% in 1% units. Typically, when the state of charge of the battery satisfies a predetermined condition, such a product blocks charging to prevent overcharge and displays the remaining charge amount of the battery as 100%. Then, when the charge amount of the battery pack falls below a certain level (e.g., 96%), charging is resumed. Therefore, when the product is used for a long time while a charger is connected with the battery, due to the self-discharge characteristic of the secondary cell and current consumption of a protective circuit built into the battery pack while charging is stopped due to full-charge, the charge amount is reduced, and thus the reduced charge amount is displayed until the charge is resumed.

Thus, a user experiences that the battery charge amount is gradually reduced and is not charged to 100% even when the charger is connected to the battery, and thus the user may consider a malfunction of the charger or product.

DISCLOSURE

Technical Problem

A technical problem to be solved according to exemplary embodiments is to resolve a situation where a user suspects a malfunction of a charger or product due to a charge stop period of charging after full-charge, and to provide a battery charge amount display method that improves charging speed felt by a user and a battery pack and an electronic device for performing the same.

Technical Solution

In order to solve the above-stated problem, a battery pack according to an exemplary embodiment may include: a battery; and a battery management system that detects a charge amount of the battery, sets an indicated charge amount as the charge amount when the charge amount of the battery is lower than a first threshold value, and sets the indicated charge amount as given in Equation 1 when the charge amount of the battery is higher than the first threshold value:

$$\text{Indicated charge amount} = \text{Actual charge amount} \times \text{correction rate} = \text{actual charge amount} \times (1+((100/\text{second threshold value})-1)/(\text{second threshold value}-\text{first threshold value}) \times (\text{actual charge amount}-\text{first threshold value}))) \quad [\text{Equation 1}]$$

wherein, in Equation 1, the actual charge amount is a charge amount of the battery.

The battery management system may set the indicated charge amount as a full-charge state when the charge amount is higher than the second threshold value, and the second threshold value may be higher than the first threshold value.

The battery management system may determine that the battery satisfies a full-charge condition when the charge amount is higher than a third threshold value and stops charging of the battery, and the third threshold value may be higher than the second threshold value.

The battery management system may stop charging of the battery until the charge amount reaches the second threshold value, and may resume charging of the battery when the charge amount reaches the second threshold value.

The correction rate may be increased as the charge amount is increased.

The battery management system may adjust the first threshold value or the second threshold value according to a deterioration state of the battery.

The battery management system may control the first threshold value or the second threshold value to be decreased as the deterioration of the battery is increased.

The battery management system may adjust the first threshold value or the second threshold value according to a temperature of the battery.

The battery management system may adjust the first threshold value or the second threshold value as the temperature is increased.

The battery management system may transmit the indicated charge amount to a controller of the electronic device such that a battery charge state may be displayed corresponding to the indicated charge amount in the electronic device.

An electronic device according to an exemplary embodiment includes: a display: and a controller that receives a charge amount of a battery in a battery pack built in the electronic device, sets an indicated charge amount as the charge amount when the charge amount of the battery is lower than a first threshold value, sets the indicated charge amount as given in Equation 1 when the charge amount of the battery is higher than the first threshold value, and displays a battery charge state in the display corresponding to the indicated charge amount.

The controller may set the indicated charge amount as a full-charge state when the charge amount is higher than the second threshold value, and when the charge amount is higher than a third threshold value, the controller may determine that the battery satisfies a full-charge condition and thus stops charging of the battery, and the second threshold may be is greater than the first threshold value and the third threshold value may be greater than the second threshold value.

Charging of the battery pack may be stopped until the charge amount reaches the second threshold value, and charging of the battery pack may be resumed when the charge amount reaches the second threshold value.

The controller may control the first threshold value or the second threshold value based on at least one of a deterioration state of the battery and a temperature of the battery.

In addition, according to an exemplary embodiment, a method for displaying a battery charge amount of an electronic device is provided. The method includes: detecting a charge amount of a battery built in the electronic device; setting an indicated charge amount as the charge amount when the charge amount of the battery is lower than a first threshold value; setting the indicated battery amount as given in Equation 1 when the charge amount of the battery is higher than the first threshold value; and displaying a charging state of the battery on a screen corresponding to the indicated charge amount.

The method for displaying the battery charge amount of the electronic device may further include setting the indicated charge amount as a full-charge state when the charge amount is higher than the second threshold value, wherein the second threshold value may be higher than the first threshold value.

The method for displaying the battery charge amount of the electronic device may further include: determining that the battery satisfies a full-charge condition when the charge amount is higher than a third threshold value and stopping charging of the battery until the charge amount reaches the second threshold value; and when the charge amount gradually reduces and thus reaches the second threshold value, resuming charging of the battery, wherein the third threshold value may be higher than the second threshold value.

The method for displaying the battery charge amount of the electronic device may further include adjusting the first threshold value or the second threshold value based on at least one of a deterioration state and a temperature of the battery.

The adjusting may include reducing the first threshold value or the second threshold value as the deterioration of the battery is increased or the temperature of the battery is increased.

Advantageous Effects

According to the exemplary embodiments, a situation in which a user suspects a malfunction of a charger or a product due to a charging stop period after a full-charge of the battery can be solved, and the charging speed felt by the user of can be improved.

DESCRIPTION OF THE DRAWINGS

FIG. 5 schematically illustrates a method for displaying battery charge amount of the electronic device according to the exemplary embodiment.

MODE FOR INVENTION

Figures 1A, 1B:
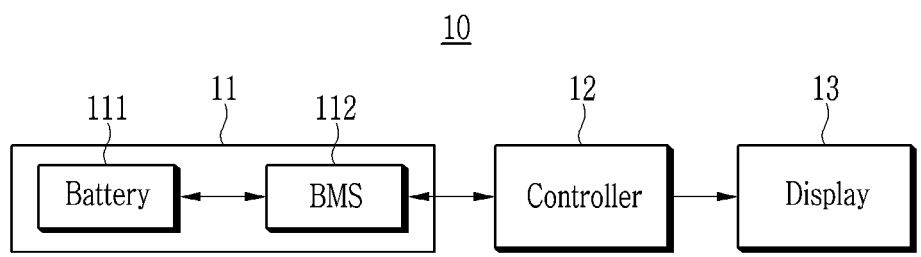
FIG. 1 schematically illustrates an electronic device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. Therefore, the reference number of the constituent elements used in a previous drawing can be used in a next drawing.

Further, in the drawings, size and thickness of each element are arbitrarily represented for better understanding and ease of description, but the present invention is not limited thereto. In the drawings, the thickness and area can be exaggerated to clearly represent the various layers and areas.

Electrically connecting two constituent elements includes not only direct connection of the two constituent elements, but also a connection between the two constituent elements via other constituent elements. Other constituent elements may include switches, resistors, and capacitors. In describing exemplary embodiments, the expression "connect/connecting" means that it is electrically connected when there is no expression of direct connection.

Hereinafter, a battery charge amount display method according to an exemplary embodiment and a battery pack and an electronic device performing the same will be described in detail with reference to necessary drawings.

Figure 2A:
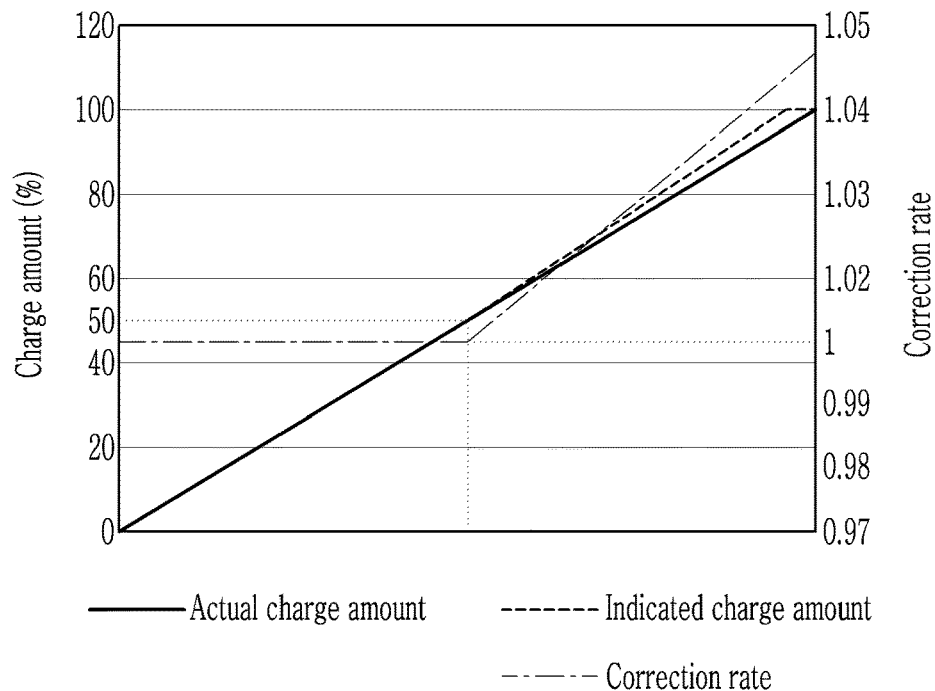
FIG. 2 shows a correlation between an actual charge amount, an indicated charge amount, and a correction rate of a battery in the electronic device according to the exemplary embodiment.
Figure 2B:
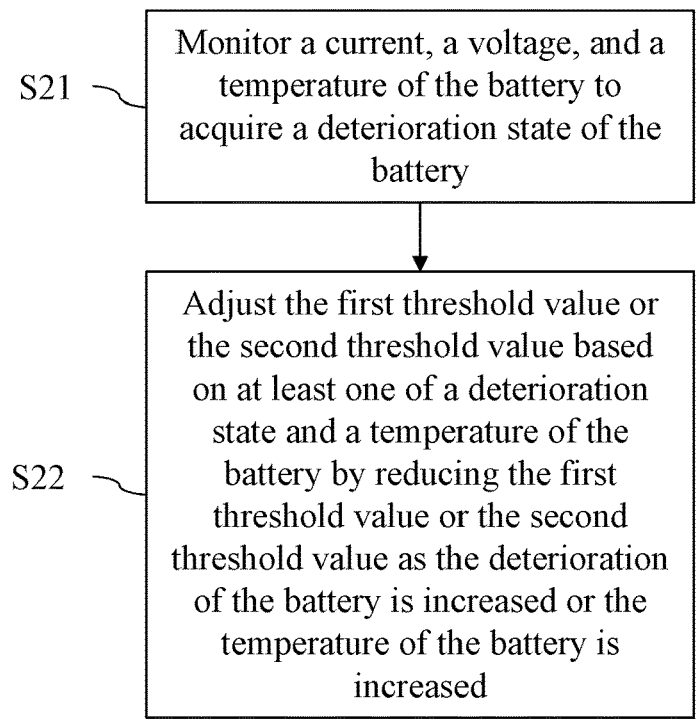

FIG. 1 schematically illustrates an electronic device according to an exemplary embodiment. FIG. 2 shows a correlation between an actual charge amount, an indicated charge amount, and a correction rate of a battery in the electronic device according to the exemplary embodiment.

Referring to FIG. 1, an electronic device 10 according to an exemplary embodiment may include a battery pack 11, a controller 12, and a display 13.

The battery pack 11 may include a battery 111 formed of at least one of cells that are connected in series or in parallel, and a battery management system (BMS) 112. In the present document, the term "cell" refers to a secondary cell, and the term "battery" indicates a modularized cell formed by at least one of battery cells coupled in series or in parallel.

In FIG. 1, it is exemplarily illustrated that the BMS 112 is located inside the battery pack 11, but the present invention is not limited thereto, and the BMS 112 may be located outside the battery pack 11, for example, inside the controller 12 of the electronic device 10.

The BMS 112 continuously detects a plurality of pieces of information related to a state of the battery 111, such as a voltage, a current, a temperature, and the like through a voltage sensor (not shown), a current sensor (not shown), a temperature sensor (not shown), and the like, and may acquires a charge amount of the battery 111 based on the information.

The BMS 112 may set a battery charge state (hereinafter, it will be called "indicated charge amount") displayed through the display 13 of the electronic device 10.

The BMS 112 may set the indicated charge amount of the battery 111 as shown in Equation 1 when the charge amount of the battery 111 is less than a first threshold value.

$$\text{Indicated charge amount} = \text{Actual charge amount} \qquad [\text{Equation 1}]$$

Referring to Equation 1, when the charge amount of the battery 111 is less than the first threshold value, the BMS 112 may set an indicated charge amount such that the displayed indicated charge capacitor becomes equal to an actual charge amount.

When the charge capacitor (i.e., the actual charge amount) of the battery 111 is greater than the first threshold value and less than a second threshold value, the BMS 112 may set the indicated charge amount of the battery 111 as shown in Equation 2.

Indicated charge amount=Actual charge amount×
correction rate [Equation 2]

In Equation 2, the correction rate may be expressed as given in Equation 3.

Correction rate=1+((100/second threshold value)−1)/
(second threshold value−first threshold value)×
(actual charge amount−first threshold value)) [Equation 3]

Referring to Equation 2 and Equation 3, the correction rate is maintained at 1 until the actual charge amount of the battery 111 reaches the first threshold value (e.g., 50%), and when the actual charge amount of the battery 111 exceeds the first threshold value, the correction rate is set to be increased as the charge amount of the battery 111 is increased. For example, the correction rate is about 1.01 when the actual charge amount is 60%, and when the actual charge rate is 90%, the correction rate is about 1.036.

When the charge amount (actual charge amount) of the battery 111 is greater than the second threshold value, the BMS 112 may set the indicated charge amount of the battery 111 to 100%, which corresponds to a full-charge state.

The BMS 112 may control charge/discharge of the battery 111 based on the charge amount of the battery 111.

The BMS 112 may stop charging of the battery 111 when the charge amount of the battery 111 satisfies a full-charge condition during charging. When the charge amount of the battery 111 exceeds a third threshold value, the BMS 112 may determine that the charge amount of the battery 111 satisfies the full-charge condition.

When the charging stop state continues, due to the self-discharge characteristic of the battery 111 and current consumption of a protective circuit (not shown) built in the battery pack 11, the charge amount of the battery 111 is reduced even when the charger is connected.

The BMS 112 may resume (or allow) charging of the battery 111 when the charge amount of the battery 111 satisfies a supplementary charging start condition while charging of the battery 111 is stopped due to detection of full-charge. The BMS 112 may determine that the charge amount of the battery 111 satisfied the supplementary charging start condition when the charge amount of the battery 111 is lower than a second threshold value while charging of the battery 111 is stopped due to full-charge of the battery 111.

According to the exemplary embodiment, the first threshold value may be set to be lower than the second and third threshold values, and the second threshold value may be set to be lower than the third threshold value. For example, when the charge amount at the full-charge state of the battery 111 is 100%, the first, second, and third threshold values may be respectively set to be 50%, 96%, and 99%.

The first, second, and third threshold values may be charged depending on a state of the battery 111.

For example, the BMS 112 continuously monitors a current, a voltage, a temperature, and the like of the battery 111 to acquire a deterioration state of the battery 111, and may change at least one of the first, second, and third threshold values based on the deterioration state. In this case, the BMS 112 may control at least one of the first, second, and third threshold values to be reduced as the battery 111 is deteriorated.

In addition, for example, the BMS 112 may change a value of at least one of the first, second, and third threshold values according to a temperature of the battery 111. The charge amount of the battery 111 may be estimated differently depending on the temperature (battery temperature or ambient temperature) of the battery 111 even if the actual charging state of battery 111 is the same. Accordingly, the BMS 112 may control at least one of the first, second, and third threshold values to be reduced as a current temperature of the battery 111 is high.

The BMS 112 may communicate with the controller 12 of the electronic device 10. For example, the BMS 112 may transmit an actual charge amount and an indicated charge amount of the battery 111 to the controller 12.

When receiving the indicated charge amount from the BMS 112, the controller 12 may display a battery charging state through the display 13 based on the received indicated charge amount.

Meanwhile, in the present specification, it is exemplarily described that a function for setting an indicated charge amount based on the charge amount of the battery 111 is carried out by the BMS 112, but the present invention is not limited thereto, and the function for setting an indicated charge amount based on the charge amount of the battery 111 can also be carried by the controller 12 of the electronic device 10. In this case, the electronic device 10 may receive actual charge amount of the battery 111 from the BMS 112 and calculate an indicated charge amount based on the received actual charge amount.

Figure 3:
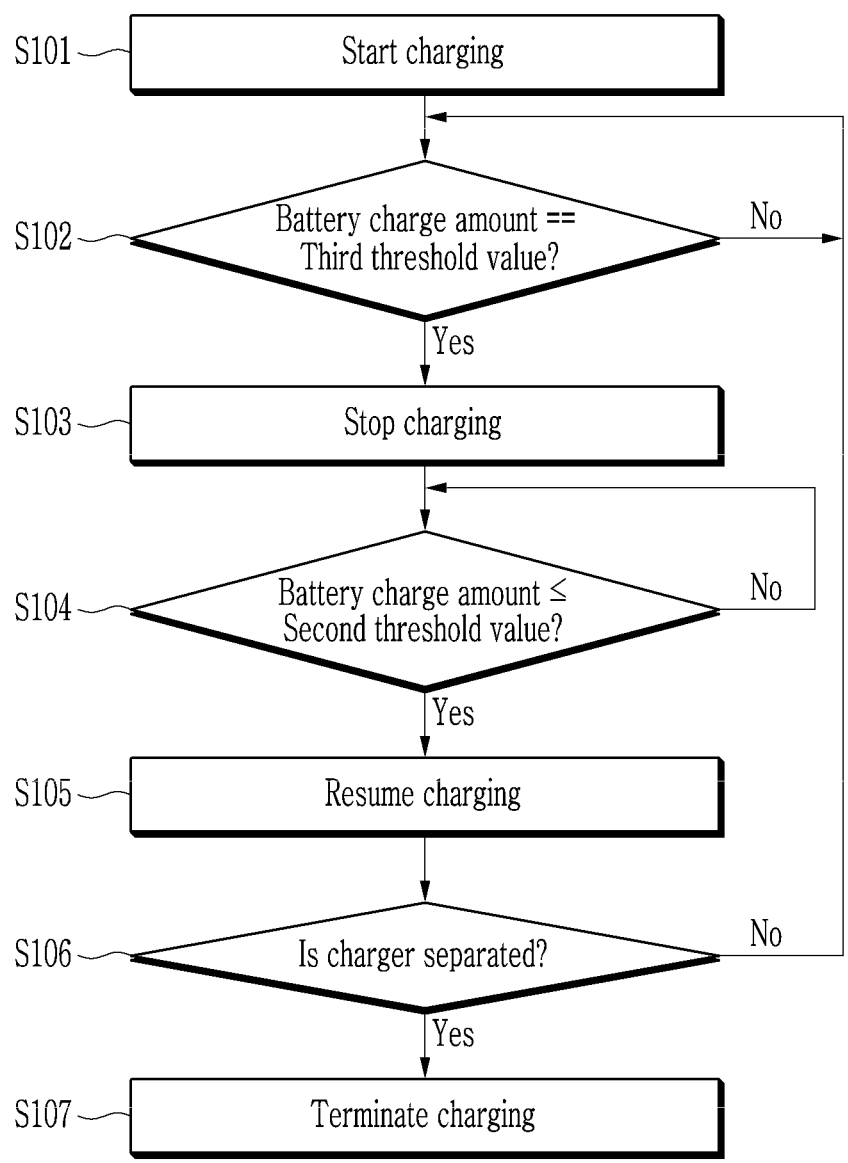
FIG. 3 schematically illustrates a method for controlling charging of a battery pack according to the exemplary embodiment.

FIG. 3 schematically illustrates a method for controlling charging of a battery pack according to the exemplary embodiment.

Figure 4:
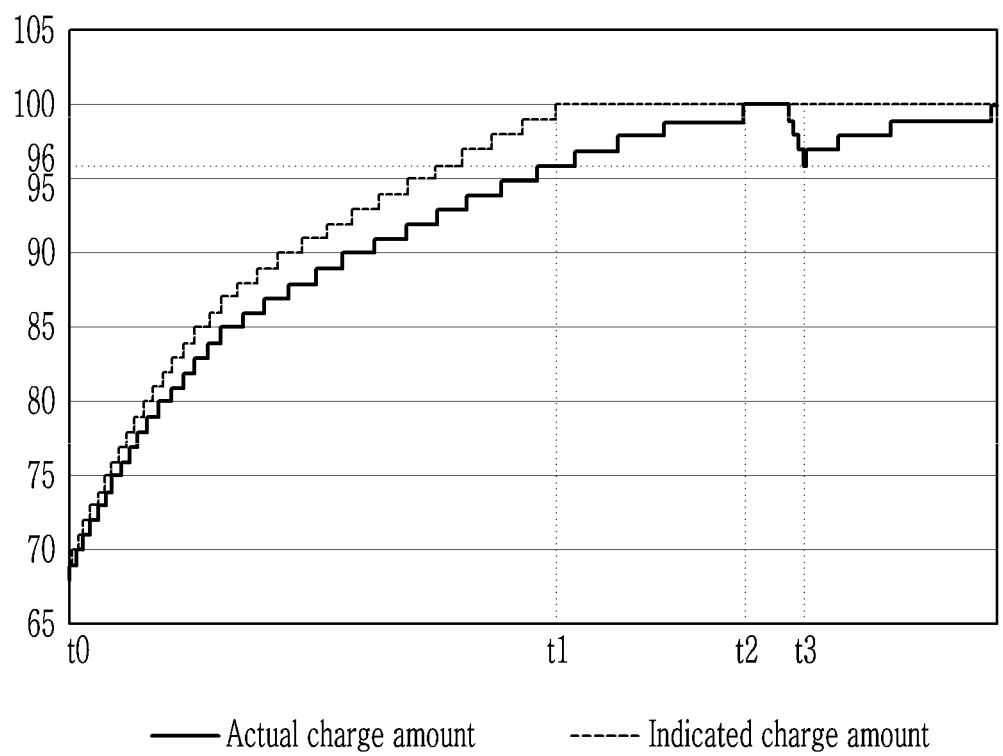
FIG. 4 schematically shows a relationship between an indicated charge amount displayed in the electronic device and an actual charge amount of the battery.

Referring to FIG. 3, the BMS 112 according to the exemplary embodiment starts charging of the battery 111 as a charger (not shown) is connected with the battery 111 (S101) (refer to t0 in FIG. 4).

While charging continues, the BMS 112 continuously detects a voltage, a current, a temperature, and the like of the batter 111 to control charging/discharging, and estimates a charge amount of the battery 111 based on the detected values.

When the battery 111 satisfies the full-charge condition during charging, that is, when the charge amount of the battery 111 reaches the third threshold value (S102), the BMS 112 stops charging to prevent overcharging of the battery 111 (S103, refer to t2 to t3 in FIG. 4).

When the charging stop state continues, due to the self-discharge characteristic of battery 111 and current consumption of a protective circuit (not shown) built in the battery pack 11, the charge amount of the battery 111 is reduced even when the charger is connected.

When the battery 111 satisfies a supplementary charging condition while the battery 111 is determined to be fully charged and thus charging of the battery 111 is stopped, that is, when the charge amount of the battery 111 becomes lower than the second threshold value (S104), the BMS 112 resumes charging of the battery 111 (S105, refer to t3 in FIG. 4).

The BMS 112 terminates charging of the battery 111 when the charger is completely separated from the battery pack 111 while iteratively performing charging, charging stop, and charging resumes through the steps S102 to S105 until the charger is separated from the battery pack 111 (S107).

FIG. 5 schematically illustrates a method for displaying battery charge amount of the electronic device according to the exemplary embodiment.

Referring to FIG. 5, the BMS 112 according to the exemplary embodiment starts charging of the battery 111 as the charger (not shown) is connected to the battery 111 (S102, refer to t0 in FIG. 4).

The BMS 112 continuously monitors a current, a voltage, a temperature, and the like of the battery 111 for charging/discharging control while charging continues, and estimates charging capacity of the battery based on the detected values.

The BMS 112 sets a displayed charge amount of the battery 111 as an actually estimated amount (S203) when the charge amount of the battery 111 is lower than the first threshold value (S202).

On the other hand, when the charge amount of the BMS 112 is higher than the first threshold value and lower than the second threshold value (S204), the BMS 112 applies a correction rate to the charge amount of the battery 111 as shown in Equation 2 and Equation 3 to thereby set an indicated charge amount (S205, refer to t0 to t1 in FIG. 4).

In addition, in a section during which the charge amount of the battery 111 is higher than the second threshold value, the BMS 112 sets the indicated charge amount as a full-charge state, for example, 100% (S206, a section after t1 in FIG. 4).

The indicated charge amount set as previously described is transmitted to the controller 12 of the electronic device 10 together with the actual charge amount of the battery 111.

When receiving the indicated charge amount and the actual charge amount from the BMS 112, the controller 12 displays a battery charge state on the screen of the electronic device 10 through the display 13 based on the indicated charge amount (S207).

According to the exemplary embodiment described above, in the state where the charging is stopped because the battery satisfies the full-charge condition, the electronic device displays the charge amount of the battery as a full-charge state even if the battery charge decreases due to the self-discharge characteristic of the battery and the power consumption of a protective circuit. Accordingly, even when the charger is connected, the indicated charge amount is reduced, so that a situation in which the user suspects a malfunction of the charger or product can be eliminated.

In addition, according to the exemplary embodiment, the electronic device can improve charging speed sensed by a user by displaying indicated charge amount in a full-charge state before the battery satisfies a full-charge condition. In addition, it has a function of hiding a situation where the battery's charge amount is corrected greatly at a time when the battery is out of the full-charge state due to an error in the calculation of the charge amount in detection of full-charge, thereby improving product reliability felt by the user.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. It will be understood by those skilled in the art that various changes in form and detail may be made without departing from the scope of the present invention. Accordingly, the true scope of the present invention should be determined by the technical idea of the appended claims.

DESCRIPTION OF SYMBOLS

10: electronic device
11: battery pack
12: controller
13: display
111: battery
112: battery management system

The invention claimed is:

1. A battery pack comprising:
a battery; and
a battery management system that detects a charge amount of the battery, sets an indicated charge amount as the charge amount when the charge amount of the battery is lower than a first threshold value, and sets the indicated charge amount as given in Equation 1 when the charge amount of the battery is higher than the first threshold value:

$$\text{Indicated charge amount} = \text{Actual charge amount} \times \text{correction rate} = \text{actual charge amount} \times (1 + ((100/\text{second threshold value}) - 1)/(\text{second threshold value} - \text{first threshold value}) \times (\text{actual charge amount} - \text{first threshold value})))  \quad [\text{Equation 1}]$$

wherein, in Equation 1, the actual charge amount is a charge amount of the battery, and
wherein the indicated charge amount is for displaying on a display as a battery charge state.

2. The battery pack of claim 1, wherein the correction rate is increased as the charge amount is increased.

3. The battery pack of claim 1, wherein the battery management system transmits the indicated charge amount to a controller of a electronic device such that a battery charge state is displayed corresponding to the indicated charge amount in the electronic device.

4. The battery pack of claim 1, wherein the battery management system adjusts the first threshold value or the second threshold value according to a deterioration state of the battery.

5. The battery pack of claim 4, wherein the battery management system controls the first threshold value or the second threshold value to be decreased as the deterioration of the battery is increased.

6. The battery pack of claim 1, wherein the battery management system adjusts the first threshold value or the second threshold value according to a temperature of the battery.

7. The battery pack of claim 6, wherein the battery management system adjusts the first threshold value or the second threshold value as the temperature is increased.

8. The battery pack of claim 1, wherein the battery management system sets the indicated charge amount as a full-charge state when the charge amount is higher than the second threshold value, and the second threshold value is higher than the first threshold value.

9. The battery pack of claim 8, wherein the battery management system determines that the battery satisfies a full-charge condition when the charge amount is higher than a third threshold value and stops charging of the battery, and the third threshold value is higher than the second threshold value.

10. The battery pack of claim 9, wherein the battery management system stops charging of the battery until the charge amount reaches the second threshold value, and resumes charging of the battery when the charge amount reaches the second threshold value.

11. An electronic device comprising:
a display: and
a controller that receives a charge amount of a battery in a battery pack built in the electronic device, sets an indicated charge amount as the charge amount when the charge amount of the battery is lower than a first threshold value, sets the indicated charge amount as given in Equation 1 when the charge amount of the battery is higher than the first threshold value, and displays a battery charge state in the display corresponding to the indicated charge amount:

Indicated charge amount=actual charge amount×correction rate=actual charge amount×(1+((100/second threshold value)−1)/(second threshold value−first threshold value)×(actual charge amount−first threshold value))) [Equation 1]

wherein, in Equation 1, the actual charge amount is a charge amount of the battery.

12. The electronic device of claim 11, wherein the correction rate is increased as the charge amount is increased.

13. The electronic device of claim 11, wherein the controller controls the first threshold value or the second threshold value based on at least one of a deterioration state of the battery and a temperature of the battery.

14. The electronic device of claim 11, wherein the controller sets the indicated charge amount as a full-charge state when the charge amount is higher than the second threshold value, and when the charge amount is higher than a third threshold value, the controller determines that the battery satisfies a full-charge condition and thus stops charging of the battery, and
the second threshold value is greater than the first threshold value and the third threshold value is greater than the second threshold value.

15. The electronic device of claim 14, wherein charging of the battery pack is stopped until the charge amount reaches the second threshold value, and charging of the battery pack is resumed when the charge amount reaches the second threshold value.

16. A method for displaying a battery charge amount of an electronic device, comprising:
detecting a charge amount of a battery built in the electronic device; setting an indicated charge amount as the charge amount when the charge amount of the battery is lower than a first threshold value;
setting the indicated charge amount as given in Equation 1 when the charge amount of the battery is higher than the first threshold value; and
displaying a charging state of the battery on a screen corresponding to the indicated charge amount:

Indicated charge amount=actual charge amount×correction rate=actual charge amount×(1+((100/second threshold value)−1)/(second threshold value−first threshold value)×(actual charge amount−first threshold value))) [Equation 1]

wherein, in Equation 1, the actual charge amount is a charge amount of the battery.

17. The method for displaying the battery charge amount of the electronic device of claim 16, further comprising setting the indicated charge amount as a full-charge state when the charge amount is higher than the second threshold value,
wherein the second threshold value is higher than the first threshold value.

18. The method for displaying the battery charge amount of the electronic device of claim 17, further comprising:
determining that the battery satisfies a full-charge condition when the charge amount is higher than a third threshold value and stopping charging of the battery until the charge amount reaches the second threshold value; and
when the charge amount gradually reduces and thus reaches the second threshold value, resuming charging of the battery,
wherein the third threshold value is higher than the second threshold value.

19. The method for displaying the battery charge amount of the electronic device of claim 16, further comprising adjusting the first threshold value or the second threshold value based on at least one of a deterioration state and a temperature of the battery.

20. The method for displaying the battery charge amount of the electronic device of claim 19, wherein the adjusting comprises reducing the first threshold value or the second threshold value as the deterioration of the battery is increased or the temperature of the battery is increased.

* * * * *